(12) United States Patent
Kim et al.

(10) Patent No.: US 9,577,207 B2
(45) Date of Patent: Feb. 21, 2017

(54) ORGANIC LIGHT EMITTING DISPLAY DEVICE WITH INSULATING PART AND METHOD OF MANUFACTURING THE SAME

(71) Applicant: LG Display Co., Ltd., Seoul (KR)

(72) Inventors: Young Mi Kim, Incheon (KR); Joon Young Heo, Seoul (KR); Yeon Kyeong Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/585,428

(22) Filed: Dec. 30, 2014

(65) Prior Publication Data

US 2015/0188077 A1 Jul. 2, 2015

(30) Foreign Application Priority Data

Dec. 31, 2013 (KR) ........................ 10-2013-0169483
Apr. 25, 2014 (KR) ........................ 10-2014-0049850

(51) Int. Cl.
*H01L 51/52* (2006.01)
*H01L 27/32* (2006.01)

(52) U.S. Cl.
CPC ....... *H01L 51/5203* (2013.01); *H01L 27/3246* (2013.01); *H01L 51/5228* (2013.01); *H01L 2251/5392* (2013.01); *H01L 2251/558* (2013.01); *H01L 2251/568* (2013.01)

(58) Field of Classification Search
CPC ............. H01L 27/3246; H01L 27/3244; H01L 27/1255; H01L 51/5012; H01L 2251/5315; H01L 51/5072; H01L 51/5228; H01L 51/5206; H01L 27/3248; H01L 27/3258; H01L 51/5203; H01L 51/5221; H01L 2251/5392
See application file for complete search history.

(56) References Cited

U.S. PATENT DOCUMENTS

| | | | |
|---|---|---|---|
| 7,915,613 B2* | 3/2011 | Park | H01L 51/5209 257/59 |
| 2001/0000744 A1* | 5/2001 | Wolk | B41M 3/006 430/200 |
| 2007/0046186 A1* | 3/2007 | Kim | H01L 51/5225 313/504 |
| 2008/0157663 A1* | 7/2008 | Sung | H01L 51/5203 313/504 |
| 2010/0102713 A1* | 4/2010 | Seo | H01L 51/525 313/504 |
| 2011/0291119 A1* | 12/2011 | Ryu | H01L 27/3276 257/88 |
| 2011/0315971 A1* | 12/2011 | Rokuhara | H01L 51/0005 257/40 |

(Continued)

*Primary Examiner* — Mohsen Ahmadi
(74) *Attorney, Agent, or Firm* — Fenwick & West LLP

(57) ABSTRACT

Disclosed is an organic light emitting display device. The organic light emitting display device includes a substrate, a pixel electrode disposed on the substrate, an organic emission layer disposed on the pixel electrode, a common electrode including a metal layer disposed on the organic emission layer, a conductive organic layer disposed on the metal layer, and a first metal oxide layer disposed on the conductive organic layer, and an insulating part formed in a part of an area of a surface of the metal layer which is exposed to a foreign material. The insulating part insulates the pixel electrode from the common electrode.

20 Claims, 4 Drawing Sheets

(56) References Cited

U.S. PATENT DOCUMENTS

| | | | | |
|---|---|---|---|---|
| 2012/0074388 A1* | 3/2012 | Park | .................... | H01L 27/3258 257/40 |
| 2012/0097956 A1* | 4/2012 | Yun | ........................ | B82Y 20/00 257/59 |
| 2012/0112628 A1* | 5/2012 | Yoon | ................... | H01L 51/5234 313/504 |
| 2013/0015459 A1* | 1/2013 | Lee | ..................... | H01L 27/3265 257/72 |
| 2014/0145152 A1* | 5/2014 | Chung | ................ | H01L 27/3206 257/40 |
| 2014/0151652 A1* | 6/2014 | Im | ........................ | H01L 51/5228 257/40 |
| 2014/0239272 A1* | 8/2014 | Kim | ................... | H01L 51/5218 257/40 |
| 2014/0284572 A1* | 9/2014 | Oooka | ................. | H01L 51/525 257/40 |
| 2014/0346470 A1* | 11/2014 | Choi | ................... | H01L 27/3244 257/40 |
| 2014/0367707 A1* | 12/2014 | Meng | ................ | H01L 27/3253 257/88 |
| 2015/0138463 A1* | 5/2015 | Jinta | ................... | H01L 51/5218 349/33 |
| 2015/0185903 A1* | 7/2015 | Park | ........................ | G06F 3/044 345/173 |

* cited by examiner

ORGANIC LIGHT EMITTING DISPLAY DEVICE WITH INSULATING PART AND METHOD OF MANUFACTURING THE SAME

CROSS-REFERENCE TO RELATED APPLICATIONS

This application claims the benefit of the Korean Patent Application No. 10-2013-0169483 filed on Dec. 31, 2013 and Korean Patent Application No. 10-2014-0049850 filed on Apr. 25, 2014, which are hereby incorporated by reference as if fully set forth herein.

BACKGROUND

Technical Field

The present disclosure relates to an organic light emitting display device and a method of manufacturing the same, and more particularly, to an active matrix (AM) organic light emitting display device and a method of manufacturing the same.

Discussion of the Related Art

Flat panel display devices, which are light and thin, are being actively developed. Representative examples of the flat panel display devices include liquid crystal display (LCD) devices and organic light emitting display devices.

The organic light emitting display devices do not use a separate light source such as a backlight applied to the LCD devices, and thus are thinner, have lower power consumption, and good color reproducibility. Accordingly, the organic light emitting display devices provide a relatively sharper image.

In an active matrix organic light emitting display device that is a type of the organic light emitting display device, a pixel is independently driven, and includes three sub-pixels of red, green, and blue.

Each of the three sub-pixels is defined by intersection between a gate line and a data line, and is independently driven by a driving circuit including a separate thin film transistor (TFT).

Each sub-pixel includes an organic light emitting diode (OLED) which is driven by the driving circuit. The OLED includes a pixel electrode, a common electrode, and an organic emission layer formed between two the electrodes. Foreign materials, such as a particle having a diameter greater than a thickness of the pixel electrode, the common electrode, or the organic emission layer, can occur in a process of forming the OLED.

The pixel electrode may be patterned and formed by a photolithography process. After the pixel electrode is formed, the foreign materials can remain.

There is a high possibility that the foreign materials occur in a process of forming thin layers which are formed on a substrate in common. Representative examples of the thin layers, which are formed on the substrate in common, include the organic emission layer and the common electrode.

In particular, the organic emission layer may be formed by a vacuum deposition process using a shadow mask, a laser transfer process, a thermal transfer process, or a screen printing process. Residual materials can remain after a process. Also, in a top emission type organic light emitting display device, light is output through the common electrode, and a luminance of a central portion of a screen can be reduced due to an increase in a resistance. Therefore, an auxiliary electrode connected to the common electrode may be formed in plurality at the central portion of the screen, for preventing luminance from being reduced due to an increase in a resistance of the central portion of the screen.

A metal oxide layer having a large step coverage may be used for connecting the common electrode to the auxiliary electrode. In this case, the metal oxide layer penetrates into a gap between foreign materials, and for this reason, a possibility that short circuit between the pixel electrode and the common electrode can more increase.

FIG. 1 is a cross-sectional view illustrating an organic light emitting display device in which a defect occurs due to a foreign material. In FIG. 1, the foreign material is illustrated as a particle P.

Referring to FIG. 1, the particle P can occur in a process of forming a pixel electrode 120, an organic emission layer 150, and a common electrode 160 which are formed on a substrate 110. When a diameter of the particle P is greater than a thickness of each of the pixel electrode 120, the organic emission layer 150, and the common electrode 160, the pixel electrode 120 is connected to the common electrode 160, causing short circuit. Here, the common electrode 160 may include a metal layer 161 and a conductive organic layer 162. In FIG. 1, reference numeral 121 refers to an auxiliary electrode, reference numeral 130 refers to a bank layer, and reference numeral 140 refers to a partition layer.

When short circuit occurs between the pixel electrode 120 and the common electrode 160, a current does not flow in the organic emission layer 150, and for this reason, a whole pixel cannot emit light. Therefore, a pixel in which short circuit occurs between the pixel electrode 120 and the common electrode 160 may be a defective pixel which cannot emit light.

SUMMARY

Accordingly, the present disclosure is directed to provide an organic light emitting display device and a method of manufacturing the same that substantially obviate one or more problems due to limitations and disadvantages of the related art.

An aspect of the present disclosure is directed to provide an organic light emitting display device that can prevent a defective pixel from occurring.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including: a substrate; a pixel electrode disposed on the substrate; an organic emission layer disposed on the pixel electrode; a common electrode including a metal layer disposed on the organic emission layer, a conductive organic layer disposed on the metal layer, and a first metal oxide layer disposed on the conductive organic layer; and an insulating part formed in a part of an area of a surface of the metal layer, the part of the area of the surface having been exposed to a foreign material, wherein the insulating part insulates the pixel electrode from the common electrode.

In another aspect of the present disclosure, there is provided a method of forming an organic light emitting display device including: forming a pixel electrode on a substrate; forming an organic emission layer on the pixel electrode; forming a common electrode that includes a metal layer disposed on the organic emission layer, a conductive organic layer disposed on the metal layer, and a first metal oxide layer disposed on the conductive organic layer; and forming an insulating part in a part of an area of a surface of the metal layer having been exposed to a foreign material.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, embodiments of the present disclosure will be described in detail with reference to the accompanying drawings.

Figure 1:
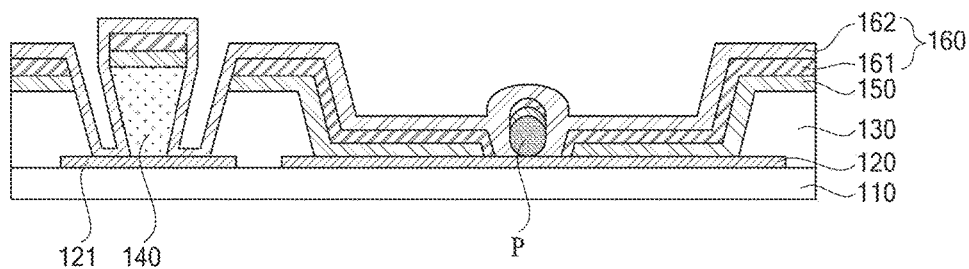
FIG. 1 is a cross-sectional view illustrating an organic light emitting display device in which a defect occurs due to a foreign material.
Figure 2:
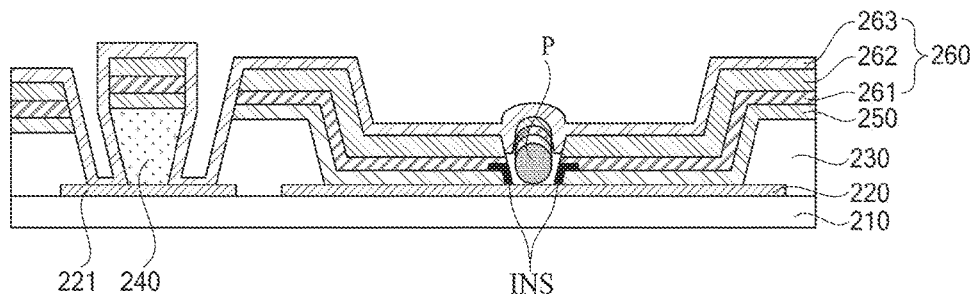
FIG. 2 is a cross-sectional view illustrating an organic light emitting display device according to an embodiment of the present disclosure.

FIG. 2 is a cross-sectional view illustrating an organic light emitting display device according to an embodiment of the present disclosure. As illustrated in FIG. 2, the organic light emitting display device according to an embodiment of the present disclosure includes a substrate 210, a pixel electrode 220, a common electrode 260, and an organic emission layer 250 disposed between the pixel electrode 220 and the common electrode 260.

First, the substrate 210 may include one selected from glass, plastic, and metal. The substrate 210 may be implemented as a flexible substrate that is formed of one of the materials.

The plastic may be one selected from polyethersulphone (PES), polyacrylate (PAR), polyetherimide (PEI), polyethyelenen napthalate (PEN), polyethyelene terephthalate (PET), polyphenylene sulfide (PPS), polyallylate, polyimide, polycarbonate (PC), cellulose triacetate (TAC), and cellulose acetate propionate (CAP).

Subsequently, the pixel electrode 220 is disposed on the substrate 210. In the present embodiment, the pixel electrode 220 may be an anode electrode, and may be formed of a single layer or a multi-layer that includes at least one selected from indium, silver (Ag), zinc, tin, aluminum zinc oxide (AZO), gallium zinc oxide (GZO), zinc oxide (ZnO), indium tin oxide (ITO), indium zinc oxide (IZO), and indium tin zinc oxide (ITZO). When the pixel electrode 220 is formed of a multi-layer, the pixel electrode 220 may include at least one transparent conductive oxide layer and at least one metal layer.

The transparent conductive oxide layer has a high work function, and thus may supply a positive hole to the organic emission layer 250. The transparent conductive oxide layer may contact the organic emission layer 250.

Subsequently, the organic emission layer 250 is disposed on the pixel electrode 220.

The organic emission layer 250 is formed of a thin layer of an organic material, and generates light by using a positive hole and an electron which are injected through the pixel electrode 220 and the common electrode 260. Although not shown in FIG. 2, the organic emission layer 250 may include a hole injection layer (HIL), a hole transport layer (HTL), an emission layer (EML), and an electron transport layer (ETL).

In the present embodiment, the pixel electrode 220 acts as the anode electrode, and the common electrode 260 may act as a cathode electrode. However, the present embodiment is not limited thereto.

The HIL is a buffering layer that lowers an energy barrier between the pixel electrode 220 and the EML to enhance efficiency in which a positive hole is injected from the pixel electrode 220. The HTL constrains an electron, which is injected from the common electrode 260 and is transported to the EML, in the EML to increase efficiency in which an electron and a positive hole are recombined in the EML. Similarly, the ETL is a buffering layer that lowers an energy barrier between the common electrode 260 and the EML. The ETL enhances efficiency in which an electron is injected from the common electrode 260, and constrains a positive hole, transported to the EML, in the EML to increase efficiency in which an electron and a positive hole are recombined in the EML. The EML is formed of a thin layer of a low-molecular organic material or a polymer-based organic material. In the EML, a positive hole and an electron which are injected from the pixel electrode 220 and the common electrode 260 and transported to the EML are recombined to generate an exciton, and energy which is emitted by shifting the exciton from an excited state to a ground state is generated as light. In this case, a color of emitted light is changed according to band-gap energy of an organic material forming the EML.

Subsequently, the common electrode 260 is disposed on the organic emission layer 250. In more detail, the common electrode 260 may include a metal layer 261 disposed on the organic emission layer 250, a conductive organic layer 262 disposed on the metal layer 261, and a first metal oxide layer 263 disposed on the conductive organic layer 262.

Since the common electrode 260 acts as the cathode electrode, the common electrode 260 may supply an electron to the organic emission layer 250. In order to supply an electron to the organic emission layer 250, a work function of an area contacting the organic emission layer 250 may be relatively lower than that of the pixel electrode 220. Therefore, metal that is a material having a low work function may be disposed in an area contacting the organic emission layer 250. Therefore, the metal layer 261 is disposed in the area contacting the organic emission layer 250. That is, the metal layer 261 may be disposed on the organic emission layer 250.

The metal layer 261 may include one or at least one selected from silver (Ag), magnesium (Mg), calcium (Ca), aluminum (Al), lithium (Li), and neodymium (Nd). The metal layer 261 may be formed of one of the following alloys, or may include one or at least one of the following alloys. Examples of the alloys may include LiF/Al, CsF/Al, Mg:Ag, Ca/Ag, Ca:Ag, LiF/Mg:Ag, LiF/Ca/Ag, and LiF/Ca:Ag, but are not limited thereto.

Moreover, the metal layer 261 may include an insulating part INS formed at a part of a surface which is exposed to a foreign material in a whole surface of the metal layer 261. There is a possibility that an undesired foreign material occurs in a process of forming the pixel electrode 220, the organic emission layer 250, or the common electrode 260. As illustrated in FIG. 2, when a particle P which is greater than a thickness of each thin layer is generated, short circuit can occur because the pixel electrode 220 is connected to the common electrode 260, and particularly, the metal layer 261. In this case, a pixel in which a foreign material is disposed cannot emit light.

Therefore, forming of the common electrode 260 is completed, and then, when short circuit between the pixel electrode 220 and the common electrode 260 occurs in an area where the particle P is disposed, the metal layer 261 in an area where the pixel electrode 220 contacts the common electrode 260 is oxidized by applying a reverse voltage to the pixel electrode 220 and the common electrode 260, thereby forming the insulating part INS. Therefore, the insulating part INS prevents short circuit from occurring between the pixel electrode 220 and the common electrode 260, and insulates the pixel electrode 220 from the common electrode 260. The metal layer 261 in an area where the pixel electrode 220 contacts the common electrode 260, as illustrated in FIG. 2, may be a surface of the metal layer 261 in the area where the particle P is disposed.

The conductive organic layer 262 is disposed on the metal layer 261. The conductive organic layer 262 may be formed of a conductive organic material, or may include a conductive organic material. Since the conductive organic layer 262 should have conductivity, the conductive organic layer 262 may include one of materials forming the organic emission layer 250, or may be formed of the same material as that of the organic emission layer 250.

A thickness of the conductive organic layer 262 may be 100 Å to 5,000 Å. The conductive organic layer 262 is formed for preventing the first metal oxide layer 262 from being connected to or communicating with the pixel electrode 220, and thus can prevent the first metal oxide layer 262 from penetrating into a gap between the particle P and the conductive organic layer 262 in a state of maintaining the thickness or more.

The conductive organic layer 262 allows the metal layer 261, which is a lowermost layer configuring the common electrode 260, to communicate with the first metal oxide layer 263 that is an uppermost layer of the common electrode 260, and thus increases a volume of the common electrode 260, thereby preventing a resistance from increasing and preventing a voltage from being dropped. In particular, the first metal oxide layer 263 may be connected to a below-described auxiliary electrode 221, and thus, the conductive organic layer 262 allowing the metal layer 261 to communicate with the first metal oxide layer 263 is very important for increasing a resistance and dropping a voltage.

The auxiliary electrode 221 is disposed on the substrate 210, and may be supplied with the same voltage as a voltage applied to the common electrode 260. In the present embodiment, the common electrode 260 acts as the cathode electrode, and may be connected to a low-level voltage terminal (Vss).

Therefore, the auxiliary electrode 221 may be connected to the low-level voltage terminal (Vss). The pixel electrode 220 acts as the anode electrode, and may be connected to a high-level voltage terminal (Vdd).

Moreover, the auxiliary electrode 221 may be formed simultaneously with a process of forming the pixel electrode 220, and thus may be disposed on the same layer as that of the pixel electrode 220.

That is, the auxiliary electrode 221 may be formed of the same material as that of the pixel electrode 220, or may include the same material as that of the pixel electrode 220.

When the pixel electrode 220 is formed of a single layer, the auxiliary electrode 221 may be formed of the same material as that of the single layer. When the pixel electrode 220 is formed by stacking a plurality of thin layers, the auxiliary electrode 221 may be formed of the same material as that of one of the thin layers.

The auxiliary electrode 221 is connected to the common electrode 260 so as to prevent a voltage of the common electrode 260 from being dropped, and particularly, may be connected to the first metal oxide layer 263. The common electrode 260 may be connected to the low-level voltage terminal (Vss) at a pad part in a non-display area (not shown) that is an edge area of the substrate 210, and may not connected to the low-level voltage terminal (Vss) at a central portion of the substrate 210. Therefore, a resistance of the common electrode 260 increases at the central portion of the auxiliary electrode 221, causing a drop of a voltage. To solve such a problem, the low-level voltage terminal (Vss) is connected to the auxiliary electrode 221, and the auxiliary electrode 221 is connected to the common electrode 260, thereby preventing a voltage from being dropped.

As described above, in order for the auxiliary electrode 221 to be connected to the common electrode 260 with the organic emission layer 250 therebetween, a partition layer 240 may be formed in an area where a bank layer 230 outside an emission area is disposed, and the auxiliary electrode 221 may be connected to the common electrode 260 through the partition layer 240. The partition layer 240 may be formed in a reverse taper shape between adjacent bank layers 230. An interval between the partition layer 240 and the bank layer 230 is small, and thus, the organic emission layer 250 and the metal layer 261 and conductive organic layer 262 of the common electrode 260 are coated on only the partition layer 240 without being connected to the auxiliary electrode 221.

However, when the first metal oxide layer 263 is formed by a sputtering process, a step coverage characteristic of the first metal oxide layer 263 becomes far better, and thus, the first metal oxide layer 263 may penetrate into a gap between the partition layer 240 and the bank layer 230 to form a thin layer. Therefore, the first metal oxide layer 263 may be connected to the auxiliary electrode 221.

Figure 5:
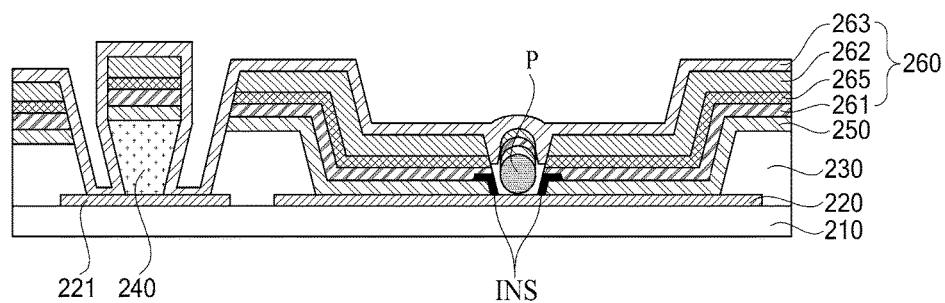
FIG. 5 is a cross-sectional view illustrating an organic light emitting display device according to another embodiment of the present disclosure.

Although not shown in FIG. 2 but shown in FIG. 5, the common electrode 260 may further include a second metal oxide layer 265 disposed between the metal layer 261 and the conductive organic layer 262.

When the second metal oxide layer 265 is included in the common electrode 260, electron injection efficiency can be enhanced, and a sheet resistance can increase.

The second metal oxide layer 265 may be thinly formed so as not to be short-circuited in connection with the pixel electrode 220, and may be formed to a thickness of 10 Å to 500 Å.

In an embodiment in where the second metal oxide layer 265 is formed, the conductive organic layer 262 may be formed to a thickness of 100 Å to 10,000 Å, and the first metal oxide layer 263 may be formed to a thickness of 100 Å to 5,000 Å.

Figure 3:
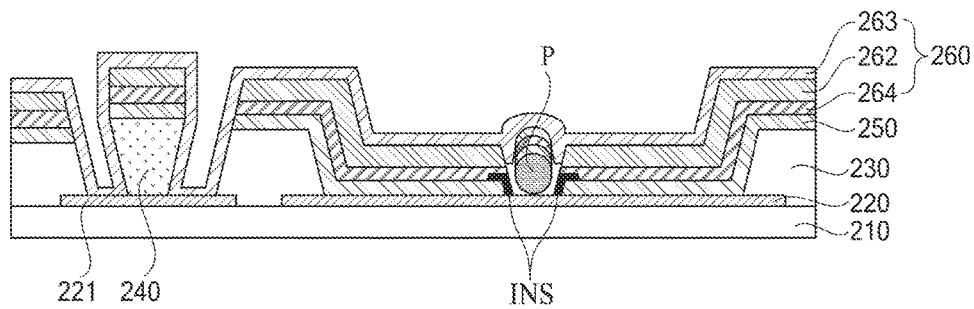
FIG. 3 is a cross-sectional view illustrating an organic light emitting display device according to another embodiment of the present disclosure.

FIG. 3 is a cross-sectional view illustrating an organic light emitting display device according to another embodiment of the present disclosure.

Referring to FIG. 3, in another embodiment of the present disclosure, a common electrode 260 does not include the metal layer of FIG. 2, and may include a first metal oxide layer 263, a conductive organic layer 262, and a second metal oxide layer 264.

When the common electrode 260 does not include the metal layer 261, a pixel electrode 220 may be connected to the common electrode 260 by a particle P, and in detail, the pixel electrode 220 may be connected to the second metal oxide layer 264 at a peripheral portion of the particle P.

The pixel electrode 220 may be connected to, through the second metal oxide layer 264, the common electrode 260 at the peripheral portion of the particle P by the particle P. Therefore, the second metal oxide layer 264 in an area where the pixel electrode 220 is connected to the common electrode 260 by the particle P is broken by a voltage applied to the pixel electrode 220 and the common electrode 260, and thus, an insulating part INS between the common electrode 260 and the pixel electrode 220 is formed at the peripheral portion of the particle P.

FIGS. 4A to 4E are cross-sectional views illustrating a method of manufacturing an organic light emitting display device according to an embodiment of the present disclosure.

Figure 4A:
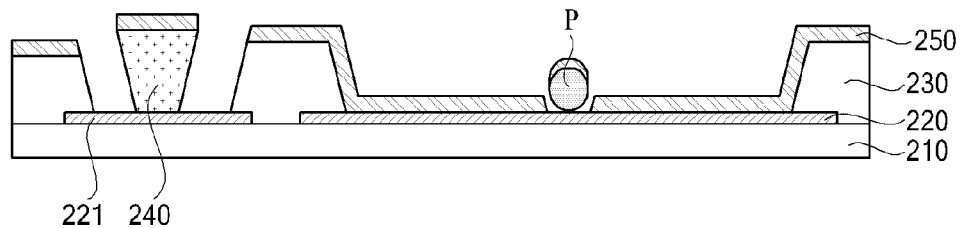
FIGS. 4A to 4E are cross-sectional views illustrating a method of manufacturing an organic light emitting display device according to an embodiment of the present disclosure.

As illustrated in FIG. 4A, the pixel electrode 220 is formed on the substrate 210. The auxiliary electrode 221 may be formed simultaneously with a process of forming the pixel electrode 220. However, the present embodiment is not limited thereto, and the auxiliary electrode 221 may be formed separately from the pixel electrode 220.

Subsequently, the bank layer 230 is formed on the pixel electrode 220. The bank layer 230 overlaps a part of an edge of the pixel electrode 220, and defines an emission area in which the pixel electrode 220 contacts the organic emission layer 250. The bank layer 230 may overlap a part of an edge of the auxiliary electrode 221. The partition layer 240 is disposed on the auxiliary electrode 221 exposed by the bank layer 230. The partition layer 240 has a reverse taper shape, and the bank layer 230 and the partition layer 240 are separated from each other to form a space into which the first metal oxide layer 263 to be formed later penetrates.

After the bank layer 230 and the partition layer 240 are formed, the organic emission layer 250 is formed on the pixel electrode 220. The organic emission layer 250 is formed all over the substrate 210 in common, and thus may be formed on the bank layer 230 and the partition layer 240. However, the organic emission layer 250 does not penetrate into the space between the bank layer 230 and the partition layer 240 to form a thin layer.

The organic emission layer 250 may be formed by a vacuum deposition process using a shadow mask, a laser transfer process, a thermal transfer process, or a screen printing process. When the particle P is formed on the pixel electrode 220, the organic emission layer 250 may not be formed in a peripheral area of the particle P.

Figure 4B:
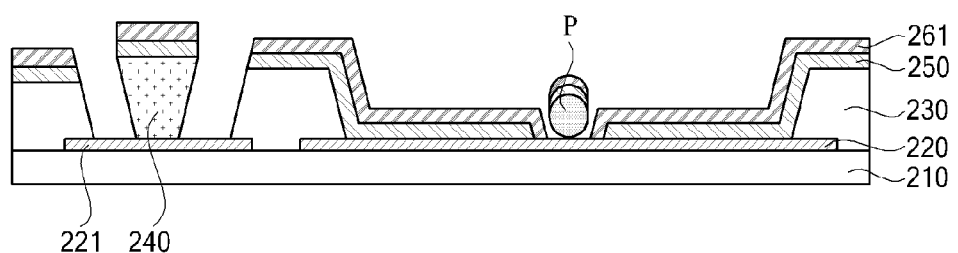

Subsequently, as illustrated in FIG. 4B, the metal layer 261 may be formed on the organic emission layer 250. Since a step coverage characteristic of the metal layer 261 is not good, the metal layer 261 may be formed in the same area as that of the organic emission layer 250. The metal layer 261 may include one or at least one selected from silver (Ag), magnesium (Mg), calcium (Ca), aluminum (Al), lithium (Li), and neodymium (Nd). The metal layer 261 may be formed of one of the following alloys, or may include alloys such as LiF/Al, CsF/Al, Mg:Ag, Ca/Ag, Ca:Ag, LiF/Mg:Ag, LiF/Ca/Ag, and LiF/Ca:Ag.

Figure 4C:
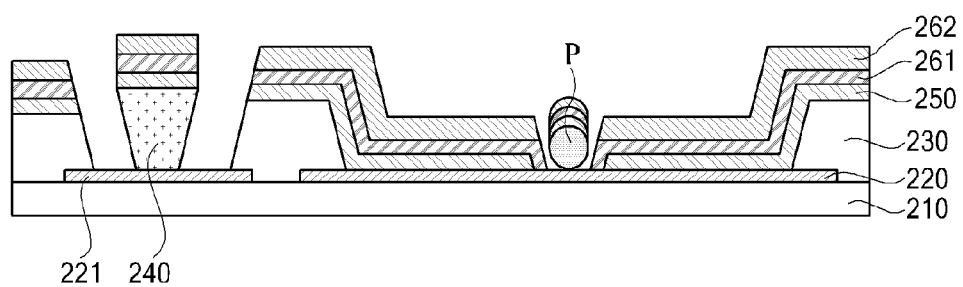

Subsequently, as illustrated in FIG. 4C, the conductive organic layer 262 may be formed on the metal layer 261. The conductive organic layer 262 may be formed to a thickness of 100 Å to 5,000 Å The conductive organic layer 262 may be formed of the same material as that of the organic emission layer 250, or may include at least one the same material.

Although not shown, the second metal oxide layer (not shown) disposed between the metal layer 261 and the conductive organic layer 262 may be further formed. The second metal oxide layer (not shown) may be formed of the same material as that of the first metal oxide layer 263, and may be thinly formed so as not to be short-circuited with the pixel electrode 220. For example, the second metal oxide layer may be formed to a thickness of 10 Å to 500 Å.

Figure 4D:
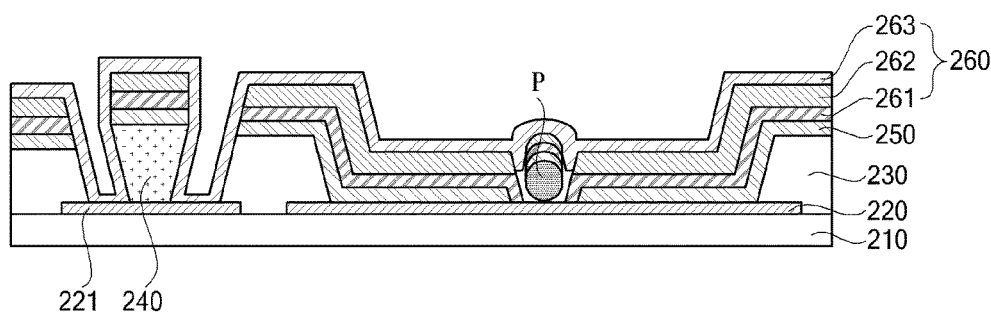

Subsequently, as illustrated in FIG. 4D, the first metal oxide layer 263 may be formed on the conductive organic layer 262. The first metal oxide layer 263 may be formed by the sputtering process, and thus, a step coverage characteristic of the first metal oxide layer 263 can be more enhanced. The first metal oxide layer 263 is connected to the auxiliary electrode 221, but is not connected to the pixel electrode 220.

Figure 4E:
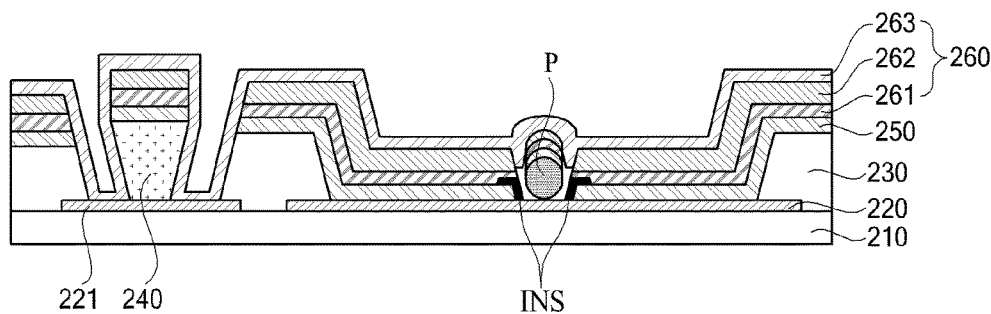

Finally, as illustrated in FIG. 4E, the common electrode 260 including the conductive organic layer 262 and the first metal oxide layer 263 is formed, and then, by applying a reverse voltage to the pixel electrode 220 and the common electrode 260, the insulating part INS is formed at a surface of the metal layer 261 exposed to the particle P that is a foreign material. In the present embodiment, since the pixel electrode 220 acts as the anode electrode and the common electrode 260 acts as the cathode electrode, by applying a low-level voltage to the pixel electrode 220 and applying a high-level voltage to the common electrode 260 to thereby apply a reverse voltage, the metal layer 261 may be oxidized, and thus, the insulating part INS may be formed at the surface of the metal layer 261 exposed to a foreign material.

Moreover, even when the first metal oxide layer 263 penetrates up to a lower portion of the particle P and thus a portion of the first metal oxide layer 263 is connected to the pixel electrode 220, short circuit between the pixel electrode 220 and the common electrode 260 can be prevented because an area in which the first metal oxide layer 263 is connected to the pixel electrode 220 is insulated by an operation of applying the reverse voltage.

As described above, the insulating part INS is formed between the pixel electrode 220 and the common electrode 260, and thus, even when a foreign material such as the particle P occurs in a process of forming an OLED including the organic emission layer, the insulating part INS prevents short circuit from occurring. Accordingly, an only area in which the particle P occurs in a pixel does not illuminate and appears dark (or black), and the other area of the pixel is normally driven, thereby preventing a defective pixel from being formed. Also, the conductive organic layer 262 is formed between the organic emission layer 250 and the common electrode 260, and prevents the first metal oxide layer 263 included in the common electrode 260 form being connected to the pixel electrode 220 through a space between the particle P and the organic emission layer 250, thereby preventing short circuit from occurring between the pixel electrode 220 and the first metal oxide layer 263.

According to the embodiments of the present disclosure, the insulating part is formed between the pixel electrode and the common electrode, and thus, even when a foreign material such as a particle occurs in a process of forming the OLED including the organic emission layer, the insulating part prevents short circuit from occurring. Accordingly, an only area in which a foreign material occurs in a pixel is blackened, and the other area of the pixel is normally driven.

Moreover, according to the embodiments of the present disclosure, since an only area in which a foreign material occurs is blackened and the other area of the pixel is normally driven, a defective pixel can be prevented from occurring.

Moreover, according to the embodiments of the present disclosure, the conductive organic layer is formed between the organic emission layer and the common electrode, and prevents the first metal oxide layer included in the common electrode from being connected to the pixel electrode, thereby preventing short circuit from occurring between the pixel electrode and the first metal oxide layer.

What is claimed is:

1. An organic light emitting display device comprising:
   a substrate;
   a pixel electrode disposed on the substrate;
   an organic emission layer disposed on the pixel electrode; and
   a common electrode including a metal layer disposed on the organic emission layer, a conductive organic layer disposed on the metal layer, and a first metal oxide layer disposed on the conductive organic layer,
   wherein the metal layer includes an insulating portion that extends toward the pixel electrode and directly contacts the pixel electrode.

2. The organic light emitting display device of claim 1, further comprising an auxiliary electrode disposed on the substrate, wherein the auxiliary electrode is connected to the first metal oxide layer.

3. The organic light emitting display device of claim 2, wherein the auxiliary electrode is supplied with a voltage equal to a voltage supplied to the common electrode.

4. The organic light emitting display device of claim 2, wherein the auxiliary electrode is disposed on the same layer as a layer of the pixel electrode.

5. The organic light emitting display device of claim 1, wherein a thickness of the first metal oxide layer is 100 Å to 5,000 Å.

6. The organic light emitting display device of claim 1, wherein the organic emission layer and the conductive organic layer are formed of the same material.

7. The organic light emitting display device of claim 1, wherein a thickness of the conductive organic layer is 100 Å to 10,000 Å.

8. The organic light emitting display device of claim 1, wherein the common electrode further comprises a second metal oxide layer disposed between the metal layer and the conductive organic layer.

9. The organic light emitting display device of claim 8, wherein a thickness of the second metal oxide layer is 10 Å to 500 Å.

10. The organic light emitting display device of claim 1, wherein the metal layer includes another insulating portion that extends toward the pixel electrode and directly contacts the pixel electrode.

11. An organic light emitting display device comprising:
    a pixel electrode disposed on a substrate;
    an organic emission layer disposed on the pixel electrode;
    a first metal oxide layer disposed on the organic emission layer;
    a conductive organic layer disposed on the first metal oxide layer; and
    a second metal oxide layer disposed on the conductive organic layer,
    wherein the first metal oxide layer includes an insulating portion that extends toward the pixel electrode and directly contacts the pixel electrode.

12. The organic light emitting display device of claim 11, wherein a thickness of the first metal oxide layer is 100 Å to 5,000 Å.

13. The organic light emitting display device of claim 11, wherein the organic emission layer and the conductive organic layer are formed of a same material.

14. The organic light emitting display device of claim 11, wherein a thickness of the conductive organic layer is 100 Å to 10,000 Å.

15. The organic light emitting display device of claim 11, wherein a thickness of the second metal oxide layer is 10 Å to 500 Å.

16. The organic light emitting display device of claim 11, wherein the first metal oxide layer includes another insulating portion that extends toward the pixel electrode and directly contacts the pixel electrode.

17. A method of forming an organic light emitting display device, the method comprising:
    forming a pixel electrode on a substrate;
    forming an organic emission layer on the pixel electrode;
    forming a common electrode that includes a metal layer disposed on the organic emission layer, a conductive organic layer disposed on the metal layer, and a first metal oxide layer disposed on the conductive organic layer; and
    modifying a portion of the metal layer to be insulating, the portion of the metal layer extending towards the pixel electrode and directly contacting the pixel electrode.

18. The method of claim 17, further comprising forming an auxiliary electrode on the substrate, wherein the auxiliary electrode is connected to the first metal oxide layer.

19. The method of claim 17, wherein modifying the portion of the metal layer comprises applying a reverse voltage to the pixel electrode and the metal layer.

20. The method of claim 17, further comprising forming a second metal oxide layer between the metal layer and the conductive organic layer.

* * * * *